(12) United States Patent
Xu

(10) Patent No.: US 9,966,307 B2
(45) Date of Patent: May 8, 2018

(54) METHOD AND SYSTEM FOR UNIFORM DEPOSITION OF METAL

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Jian Hua Xu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/348,729

(22) Filed: Nov. 10, 2016

(65) Prior Publication Data

US 2017/0221759 A1 Aug. 3, 2017

(30) Foreign Application Priority Data

Feb. 2, 2016 (CN) .......................... 2016 1 0073030

(51) Int. Cl.
*H01L 21/44* (2006.01)
*H01L 21/768* (2006.01)
(Continued)

(52) U.S. Cl.
CPC .. *H01L 21/76879* (2013.01); *H01L 21/02068* (2013.01); *H01L 21/28556* (2013.01); *H01L 21/76876* (2013.01); *H01L 21/76877* (2013.01)

(58) Field of Classification Search
CPC ......... H01L 21/76879; H01L 21/28556; H01L 21/02068; H01L 21/76865;
(Continued)

(56) References Cited

U.S. PATENT DOCUMENTS 7,235,482 B2 * 6/2007 Wu .................... H01L 21/28562
257/E21.168
8,158,532 B2 * 4/2012 Mayer ...................... B23H 5/08
216/105

(Continued)

FOREIGN PATENT DOCUMENTS

JP 10163127 6/1998

OTHER PUBLICATIONS

European Application No. 17152662.7, Extended European Search Report dated Jul. 19, 2017, 9 pages.

*Primary Examiner* — Thanh Y Tran
(74) *Attorney, Agent, or Firm* — Kilpatrick Townsend and Stockton LLP

(57) ABSTRACT

A method for manufacturing a semiconductor device includes providing a substrate, performing a nucleation process on the substrate to form a nucleation layer of a metal, performing a first deposition process at a first temperature on the nucleation layer to form a first layer of the metal, etching back the first layer of the metal using a first gas, cleaning the substrate including the etched back first layer of the metal using a second gas, and performing a second deposition process to form a second layer of the metal on the etched back first layer of the metal. By cleaning the substrate and the etched-back first layer of the metal using the second gas, the thickness fluctuation of the deposited metal layer from wafer to wafer is significantly reduced.

11 Claims, 6 Drawing Sheets

(51) Int. Cl.
*H01L 21/02* (2006.01)
*H01L 21/285* (2006.01)

(58) Field of Classification Search
CPC ......... H01L 21/76871; H01L 21/76876; H01L 21/76877
See application file for complete search history.

(56) References Cited

U.S. PATENT DOCUMENTS

| | | | |
|---|---|---|---|
| 8,415,261 B1* | 4/2013 | Reid | C23C 18/1607 204/193 |
| 2002/0113271 A1 | 8/2002 | Noguchi et al. | |
| 2010/0144140 A1* | 6/2010 | Chandrashekar | C23C 16/045 438/669 |
| 2010/0267230 A1 | 10/2010 | Chandrashekar et al. | |
| 2013/0109172 A1* | 5/2013 | Collins | H01L 21/76864 438/653 |
| 2015/0024592 A1 | 1/2015 | Chandrashekar et al. | |
| 2015/0048511 A1* | 2/2015 | Tsai | H01L 21/76865 257/763 |
| 2015/0111374 A1 | 4/2015 | Bao et al. | |
| 2015/0325497 A1* | 11/2015 | Yu | H01L 21/31116 257/774 |

* cited by examiner

METHOD AND SYSTEM FOR UNIFORM DEPOSITION OF METAL

CROSS-REFERENCES TO RELATED APPLICATIONS

This application claims priority to Chinese patent application No. 201610073030.4, filed on Feb. 2, 2016, the content of which is incorporated herein by reference in its entirety.

BACKGROUND OF THE INVENTION

Embodiments of the disclosure relate to the field of semiconductor device fabrication. More particularly, embodiments of the disclosure provide a method and system for depositing metal layers.

In the manufacturing process of integrated circuits, due to its good gap filling properties, the chemical vapor deposition process is used for depositing a tungsten material, e.g., filling a contact plug, a metal gate electrode, and the like.

As device feature sizes decrease, in order to obtain improved gap filling properties, for example, in order to reduce or eliminate smaller gaps or voids in the filling materials, a deposition-etch-deposition process is generally used.

However, the present inventor discovered that the thickness of the deposited tungsten material is uniform and the thickness fluctuation from wafer to wafer is small in a deposition process. However, the thickness of the tungsten material is uneven and the thickness fluctuation range is large across the processed wafers in a deposition-etch-deposition process. For example, the deposited tungsten material has a thickness of about 3,000 Angstroms and a fluctuation range is about ±100 Angstroms among processed wafers using a deposition process. However, the fluctuation range of the tungsten layer having the same thickness is about ±300 Angstroms among wafers in a deposition-etch-deposition process.

Thus, there is a need for a novel method and system for manufacturing a tungsten layer having a more uniform thickness among multiple wafers while maintaining good gap filling properties.

BRIEF SUMMARY OF THE INVENTION

Embodiments of the present invention overcome the aforementioned deficiencies by provide a novel method and system for forming uniform thickness of metal layers.

According to some embodiments of the present invention, a method for manufacturing a semiconductor device includes providing a substrate, performing a nucleation process on the substrate to form a nucleation layer of a metal, performing a first deposition process at a first temperature on the nucleation layer to form a first layer of the metal, etching back the first layer of the metal using a first gas, cleaning the substrate including the etched back first layer of the metal using a second gas, and performing a second deposition process to form a second layer of the metal on the etched back first layer of the metal.

In one embodiment, the second gas is a reducing gas.

In one embodiment, the second deposition process includes forming a lower metal layer of the second layer of the metal at a first temperature, and forming an upper metal layer on the lower metal layer at a second temperature, the second temperature being higher than the first temperature.

In one embodiment, performing the nucleation process includes using a first reaction gas including tungsten hexafluoride and silane or tungsten hexafluoride and diborane.

Performing the first and second deposition processes include using a second reaction gas comprising tungsten hexafluoride and hydrogen.

In one embodiment, the nucleation layer of the metal is formed in a trench of the substrate. The metal is tungsten, the first gas is a fluorine-containing gas, and the second gas is hydrogen.

In one embodiment, cleaning the substrate using the second gas is performed at a temperature in a range between 280° C. and 330° C. and with a flow rate of hydrogen in a range between 10,000 sccm and 16,000 sccm.

In one embodiment, etching back the first layer of the metal using the first gas is performed with the first gas being a nitrogen trifluoride gas with a flow rate of the nitrogen trifluoride gas in a range between 3 sccm and 20 sccm.

In one embodiment, the method may further include planarizing the second layer of the metal.

In one embodiment, the nucleation process is performed in a first station of a deposition chamber. The first deposition process is performed in a second station of the deposition chamber. The etching back is performed in an etch chamber. The cleaning is performed in the first station of the deposition chamber. The second deposition process is performed in the second station or in one or more third stations of the deposition chamber.

In one embodiment, forming the lower metal layer of the second layer of the metal at the first temperature is performed in the second station of the deposition chamber, and forming the upper metal layer on the lower metal layer at the second temperature is performed in one or more third stations of the deposition chamber.

Embodiments of the present invention also a system for manufacturing a semiconductor device. The system may include a deposition chamber having a first station, a second station, and one or more third stations, a delivery system configured to provide a substrate to the deposition chamber for processing, a processing system configured to process the substrate, and a controller configured to control the delivery system and the processing system. The system also includes an etch chamber. The delivery system provides the substrate to the first station, where the processing system performs a nucleation process on the substrate to form a nucleation layer of a metal under the control of the controller. The substrate including the nucleation layer is then provided by the delivery system to the second station, where the processing system performs a first deposition process at a first temperature to form a first layer of the metal. The delivery system further provides the substrate including the first layer of the metal to the etch chamber, where an etch-back process is performed using a first gas on the first layer of the metal. Thereafter, the delivery system returns the substrate with the etched back first layer of the metal back to the first station, wherein the processing system performs a cleaning process on the substrate using a second gas. The second gas is a reducing gas. The delivery system also provides the cleaned substrate to the second station or to the one or more third stations, where the processing system performs a second deposition process to form a second layer of the metal on the etched-back first layer of the metal.

In one embodiment, the processing system performs a first deposition process at a first temperature in the second station to form a lower metal layer of the second layer of the metal, and performs a second deposition process at a second temperature in the one or more third stations to form an upper metal layer on the lower metal layer, the second temperature being higher than the first temperature.

In one embodiment, the processing system introduces a first reaction gas including tungsten hexafluoride and silane or tungsten hexafluoride and diborane in the nucleation process, and introduces a second reaction gas including tungsten hexafluoride and hydrogen in the first and second deposition processes.

In one embodiment, the substrate comprises a trench, and the nucleation layer of the metal is formed in the trench. The metal is tungsten, the first gas is a fluorine-containing gas, and the second gas is hydrogen.

In one embodiment, the cleaning process on the substrate is performed at a temperature in a range between 280° C. and 330° C. and using hydrogen as the second gas with a flow rate in a range between 10,000 sccm and 16,000 sccm.

In one embodiment, the etch-back process is performed using a nitrogen trifluoride gas as the first gas and with a flow rate of the nitrogen trifluoride gas in a range between 3 sccm and 20 sccm.

Embodiments, advantages and features of the present invention are described in more detail below.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
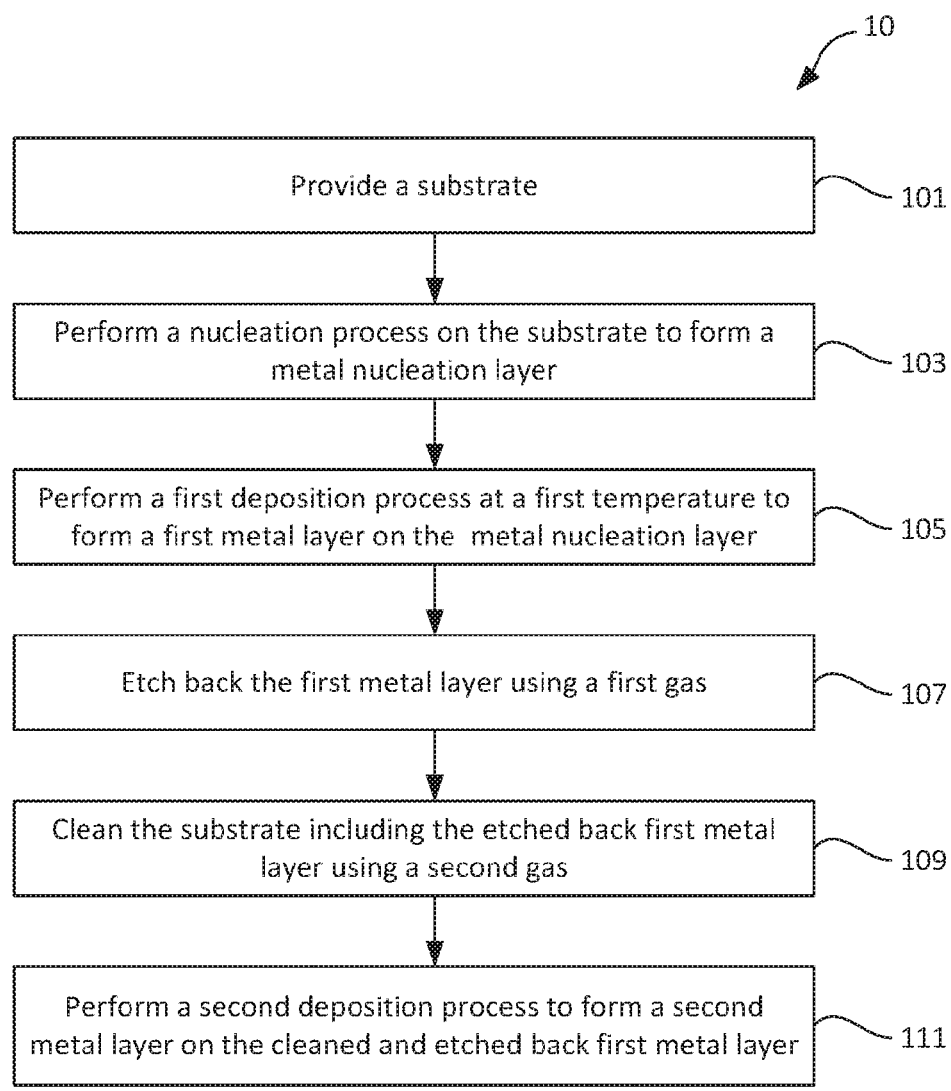
FIG. 1 is a flowchart of a method for manufacturing a semiconductor device according to some embodiments of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "higher", "lower", "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

As described in the background section, the present inventor discovered that the thickness of a formed tungsten layer is not uniform from wafer to wafer using the conventional deposition-etch-deposition process and found that, after the etch process, some residues remain, e.g., fluorine residues (in the form of ions), resulting in the passivation effect. The residues will affect the deposition of tungsten, and different levels of residues will affect the tungsten deposition to different degrees, causing the fluctuation of the tungsten thickness among wafers. Therefore, the present inventor proposes following solutions: a method and system for manufacturing a semiconductor device that provide a more uniform thickness of the deposited tungsten layer among wafers.

FIG. 1 is a flowchart of a method 10 for manufacturing a semiconductor device according to some embodiments of the present invention. Method 10 includes the following steps:

Step 101: providing a substrate, e.g., a semiconductor substrate. The substrate may include a recess or trench for forming a contact plug or a metal electrode. Other components may also be formed in the substrate, such as a shallow trench isolation (STI) structure.

Step 103: performing a nucleation process on the substrate to form a nucleation layer of a metal. Taking tungsten as the metal as an example, the nucleation process may be performed using a highly active first reaction gas. For example, the first reaction gas may include silane and tungsten hexafluoride, or tungsten hexafluoride and diborane. In addition to the above-described gases, the first reaction gas may further include hydrogen. Preferably, the nucleation process is carried out at a low temperature, e.g., in the range between 280° C. and 330° C.

Step 105: forming a first layer of the metal on the nucleation layer using a first deposition process at a first temperature.

In some embodiments, a first deposition process may be performed using a second reaction gas and a CVD process, the second reaction gas may include tungsten hexafluoride and hydrogen. The first temperature is preferably low, e.g., in the range between 280° C. and 330° C. The deposition rate at the low temperature is very low, in the range of about 1 Angstrom/s to 4 Angstrom/s to obtain a good step coverage.

Step 107: etching back the first layer of the metal (alternatively referred to as the first metal layer) using a first gas as an etchant source gas.

The first gas may include fluorine, for example, nitrogen trifluoride with a flow rate of about 3 sccm to 20 sccm, e.g., 5 sccm, 10 sccm, 15 sccm, etc. In one embodiment, the etchant source gas may be dissociated using a remote plasma source (RPS), then introduced to the etch chamber for etching.

Step 109: cleaning the substrate using a second gas after the etch back process.

The second gas may be a reducing gas suitable for removing residues resulting from the etch back process. For example, the residues may be fluorine (F) residues attached to the substrate, e.g., the residues may be present in the form of F ions. Preferably, the second gas may be hydrogen gas, reacting with fluorine according to the following reaction [H]+[F]=HF to generate the volatile acid HF for removing the attached F ions. In one embodiment, the cleaning of residues is carried out at a temperature in the range between 280° C. and 330° C., a flow rate of the hydrogen gas in the range of about 10,000 sccm to about 16,000 sccm (e.g., 12,000 sccm, 15,000 sccm, etc.) to remove residues causing by the etch back process.

Step 111: forming a second layer of the metal on the etched back first layer of the metal using a second deposition process.

For example, the second deposition may be carried out using the above-described second gas. In one embodiment, the second layer of the metal (alternatively referred to as the second metal layer) may include a lower metal layer and an upper metal layer. Forming the second metal layer on the first metal layer that has been etched back may include depositing a metal layer on the etched back first metal layer at a first temperature to form the lower metal layer, and depositing a metal layer on the lower metal layer to form an upper metal layer at a second temperature. The second temperature is preferably higher than the first temperature, e.g., the first temperature is in the range between 280° C. and 330° C., and the second temperature is in the range between 380° C. and 420° C. The deposition at a low temperature (between 280° C. and 330° C.) can better fill the gap and improve the tungsten coverage of the surface of the substrate, which facilitates the subsequent deposition of tungsten at a high temperature (between 380° C. and 420° C.). Through the CVD process at a high temperature, the tungsten layer is formed as a fast growing layer having large grains, thereby reducing the resistance of the tungsten layer.

An exemplary method for manufacturing a semiconductor according to some embodiments of the present invention is described below in conjunction with FIGS. 2A through 2F. Since the different process steps have been described in detail in the above sections, the following intermediate structures according to the corresponding steps are provided below.

Figure 2A:
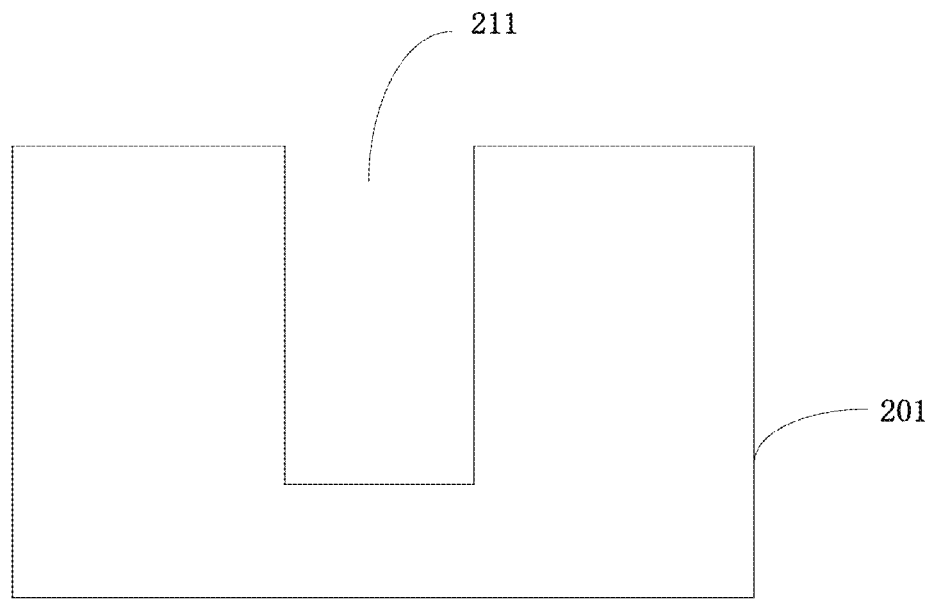
FIGS. 2A-2F are cross-sectional views illustrating intermediate stages of manufacture according to some embodiments of the present invention.

Referring to FIG. 2A, a substrate 201 having a trench 211 is provided. Trench 211 may be used to form a contact plug or a metal electrode. When a metal electrode is formed, one or more layers comprising an interface layer, a high-k dielectric layer and a work function metal layer (not shown) may be formed in trench 211.

Figure 2B:
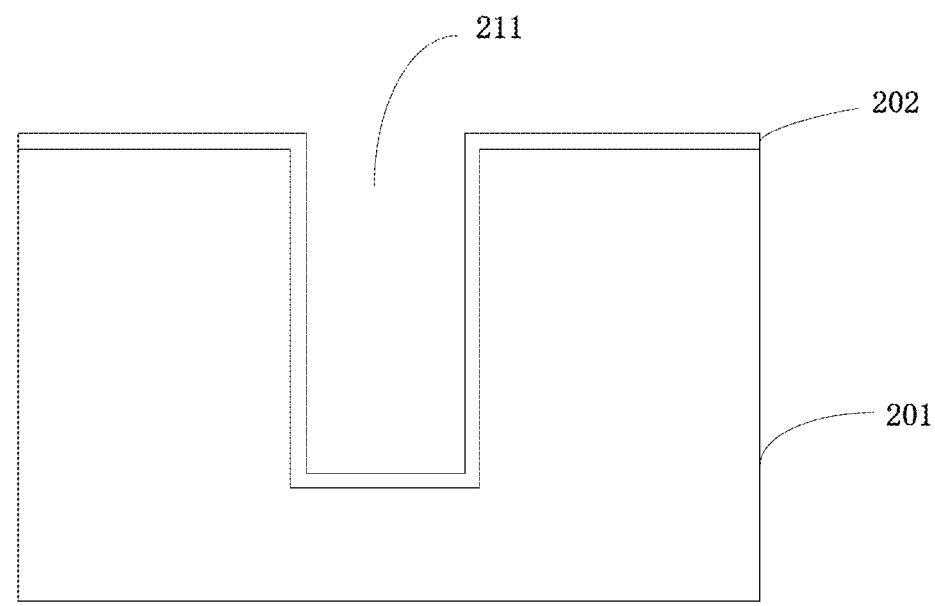

Next, referring to FIG. 2B, a nucleation process is performed on substrate 201 to form a nucleation layer of a metal 202. Nucleation layer of the metal (alternatively referred to as metal nucleation layer) 202 is formed on the surface of trench 211.

Figure 2C:
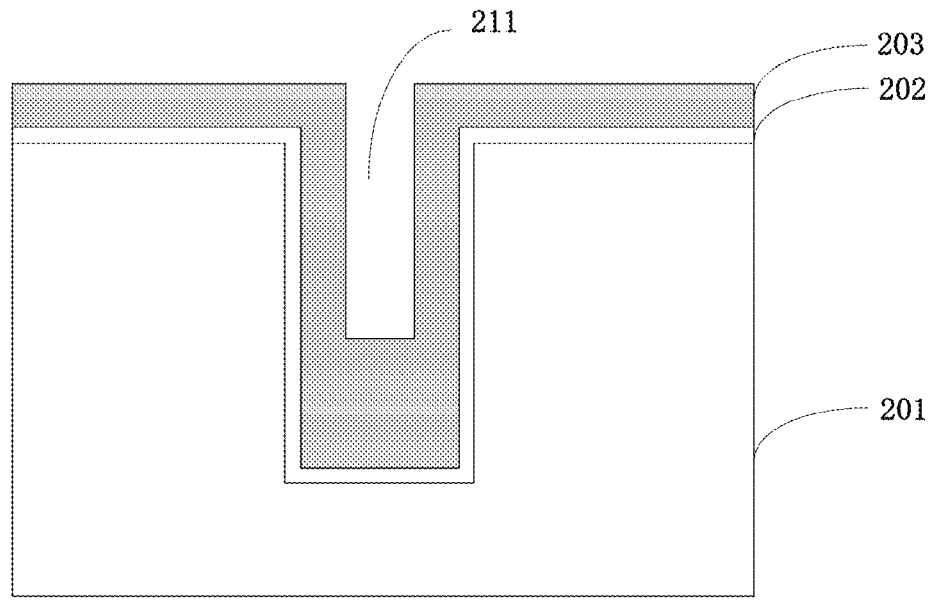

Next, referring to FIG. 2C, a first deposition process is performed at a first temperature to form a first layer of the metal (alternatively referred to as first metal layer) 203 on metal nucleation layer 202.

Figure 2D:
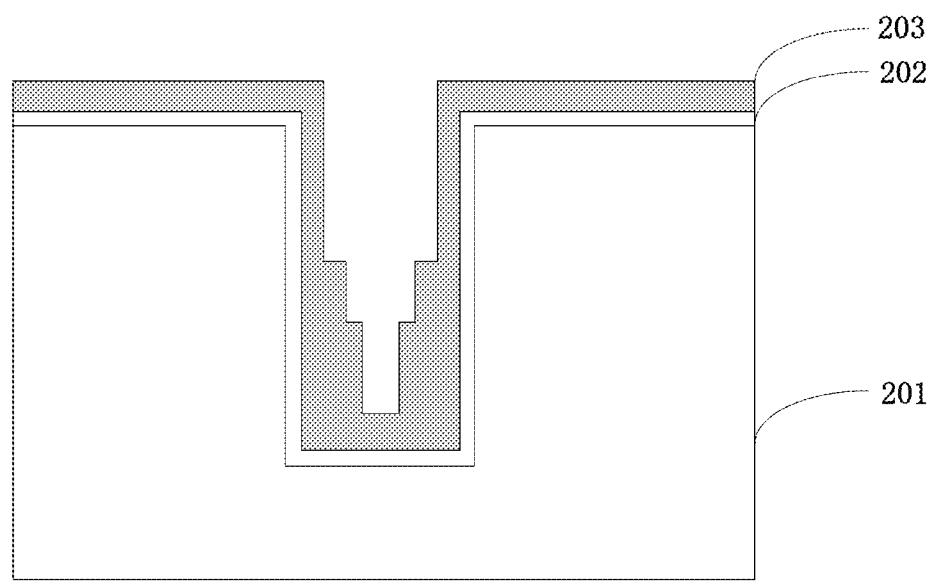

Thereafter, referring to FIG. 2D, first metal layer 203 is etched back using a first gas as an etchant source gas. Preferably, the upper portion of first metal layer 203 in trench 211 has an etch rate greater than the etch rate of the lower portion of first metal layer 203, so that a desired shape (step shaped structure) of first metal layer 203 is formed to facilitate the subsequent metal filling of trench 211.

Next, a cleaning process is carried out using a second gas as a cleaning gas to remove residues in the substrate after the first metal layer has been etched back.

Figure 2E:
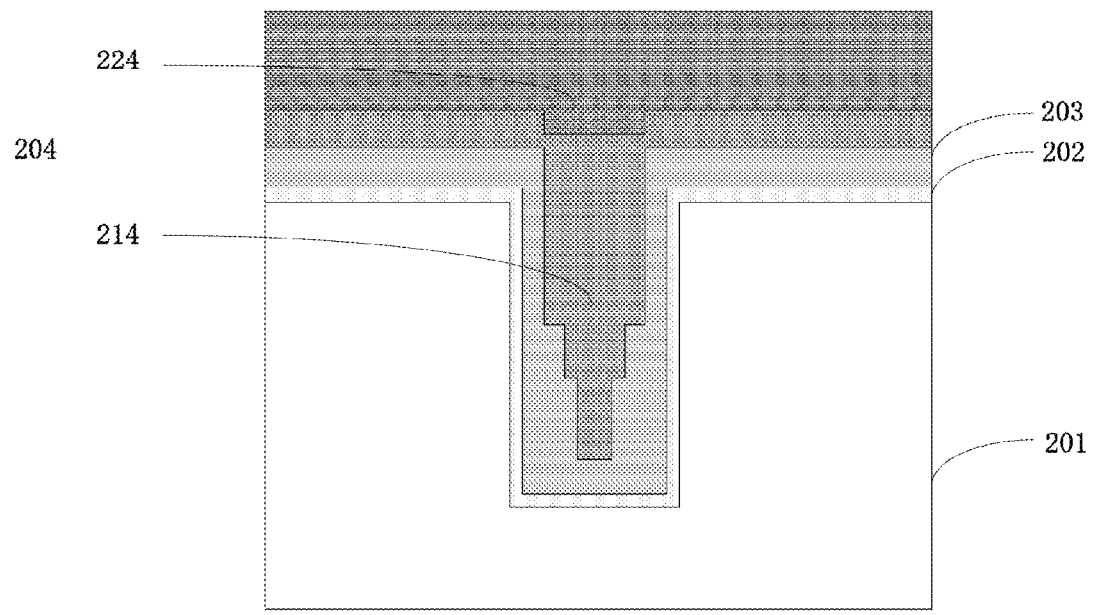

Next, referring to FIG. 2E, a second deposition process is performed to form a second metal layer 204 on first metal layer 203. In one embodiment, a deposition is performed at the first temperature to form a lower metal layer 214 on etched back first metal layer 203. Lower metal layer 214 partially or completely fills trench 211. FIG. 2E shows the case where the lower metal layer completely fills the trench. Thereafter, a deposition is further performed at the second temperature (which is preferably higher than the first temperature) to form an upper metal layer 224.

Figure 2F:
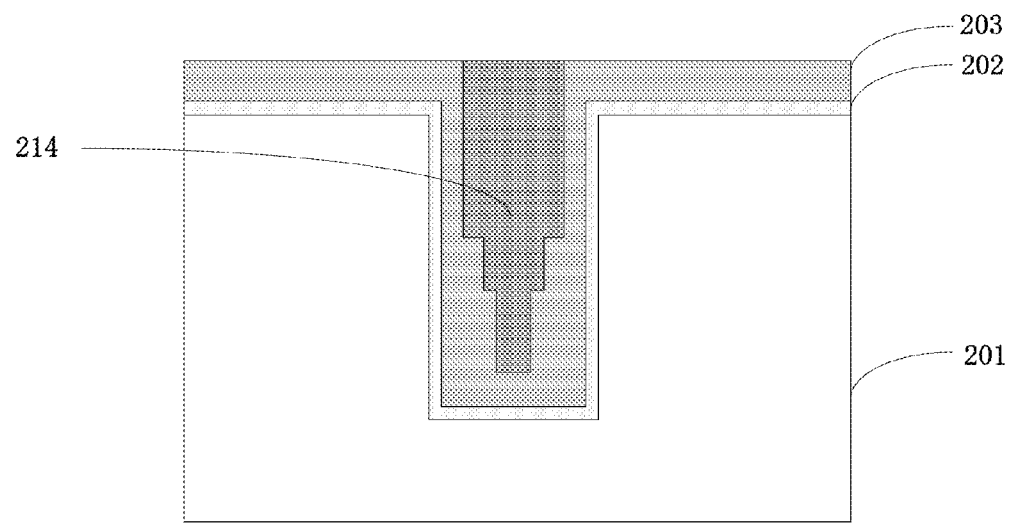

Next, referring to FIG. 2F, a planarization is performed on second metal layer 204, so that the upper surface of the second metal layer (e.g., the upper surface of the lower metal layer) is substantially flush (coplanar) with the upper surface of first metal layer 203.

Process steps shown in FIG. 1 can be carried out in different process chambers or workstations (alternatively referred to as stations hereinafter). In an exemplary embodiment, the steps may be carried out in a first deposition process chamber. The deposition process in step 105 may be performed in a second deposition process chamber. The etch back process in step 107 may be performed in an etch process chamber. The cleaning and removing process in step 109 may be performed in the first deposition process chamber. The second deposition process in step 111 may be performed in the second deposition process chamber or in one or more third deposition process chambers.

Further, in the case of forming a lower metal layer and an upper metal layer of the second metal layer 204, the deposition of the metal layer at the first temperature on the etched back metal layer 203 may be performed in the second deposition process chamber to form the lower metal layer, and the deposition of the metal layer at the second temperature on the lower metal layer may be performed in the third deposition process chamber to form the upper metal layer.

Figure 3:
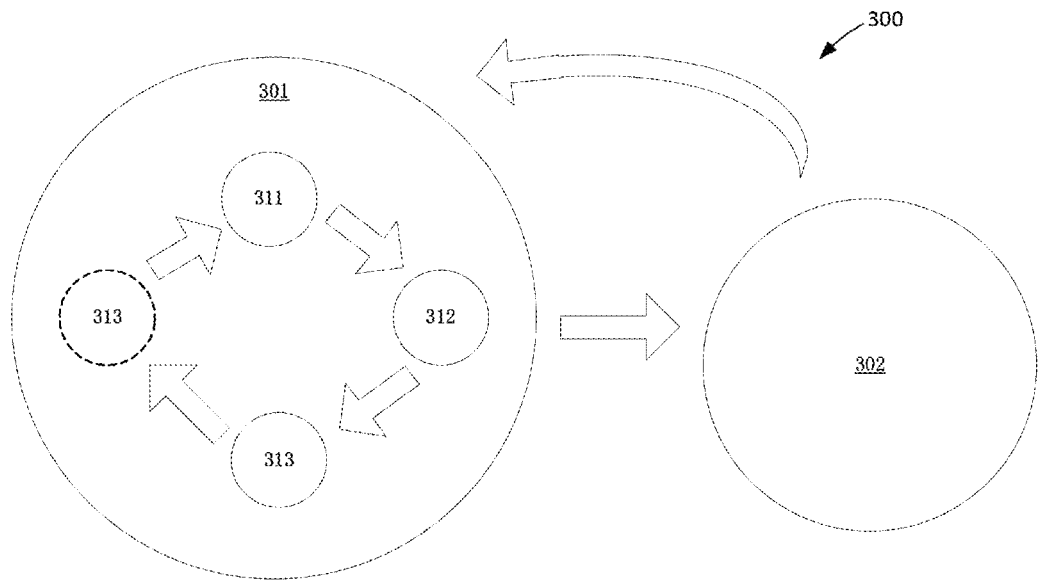
FIG. 3 is a schematic block diagram illustrating a system for manufacturing a semiconductor device according to one embodiment of the present invention.

Embodiments of the present invention also provide a system for manufacturing a semiconductor device. FIG. 3 is a schematic structural block diagram of a system 300 for manufacturing a semiconductor device. As shown in FIG. 3, system 300 includes a deposition chamber 301 and an etching chamber 302. Deposition chamber 301 may include a first station 311, a second station 312, and one or more stations 313.

The operations of each of the deposition chambers 311, 312, 313 will be described in detail below.

A substrate is provided to first station 311, where a nucleation process is performed to form a nucleation layer of a metal (referred to as a metal nucleation layer). After the nucleation treatment, the substrate is transferred to second station 312. The transfer may be performed automatically by a robot which may be programmed and controlled using a computer program executed by a computer (not shown). In one embodiment, the metal may include tungsten. In one embodiment, the substrate may include a trench, the nucleation process performed in the first station forms a metal nucleation layer in the trench of the substrate.

A deposition process is performed in second station 312 at a first temperature to form a first layer of the metal (referred to as the first metal layer) on the metal nucleation layer. Thereafter, the substrate is transferred from the second station to etching chamber 302. In one embodiment, the second station may transfer the substrate back to the first station, which then transfers the substrate to the etching station.

After the substrate including the first metal layer has been received in the etching station, the first metal layer is etched back using a first gas as a first etchant source gas. After the etching back, the substrate is transferred back to the first station. In an exemplary embodiment, the first gas may be a gas containing fluorine. For example, the first gas may be nitrogen trifluoride with a flow rate in the range between 3 sccm and 20 sccm. The substrate is then transferred back from the etching station to the first station. The transfer of the substrate from the first station to the etch station and from the etch station back to the first station can be carried out using a robot or other mechanisms controlled by one or more instruction sets executed by a computing processor. An example processing system including a deposition chamber, an etch chamber, a delivery system, a processing system, a gas system, and a controller will be described in detail below.

After the substrate is transferred back to the first station, a cleaning process is performed on the substrate using a second gas as a cleaning gas. In one embodiment, the second gas is a reducing gas, which is suitable to remove residues resulting from the etching back. The cleaning process may be performed using a hydrogen gas at a temperature in the range between 280° C. and 330° C., and the flow rate is in the range between 10,000 sccm and 16,000 sccm, e.g., 12,000 sccm, 15,000 sccm, etc.

The cleaned substrate is then transferred to second station 312 or third station 313, where a second deposition is performed on the etched back first metal layer to form a second metal layer.

In some cases, the second deposition may be performed in one of second and third stations 312 and 313. For example, the second deposition may be performed in second station 312 at the first temperature, or the second deposition may be performed in third station 313 at the second temperature that is higher than the first temperature.

In other cases, the second deposition may be performed in second station 312 and third station 313. In one embodiment, the second metal layer may include a lower metal layer and an upper metal layer. The substrate, after the cleaning step in first station 211, is transferred to second station 312. The lower metal layer is deposited on the etched back first metal layer in second station 312 at the first temperature. The substrate including the lower metal layer is then transferred to third station 313, where the upper metal layer is formed using a deposition process at the second temperature that is higher than the first temperature.

In some embodiments, the nucleation process is performed using a first reaction gas provided to first station 311. The first and second depositions are performed using a second reaction gas provided to second station 312. The first reaction gas may include silane and tungsten hexafluoride, or tungsten hexafluoride and diborane. The second reaction gas may include tungsten hexafluoride and hydrogen.

Figure 4:
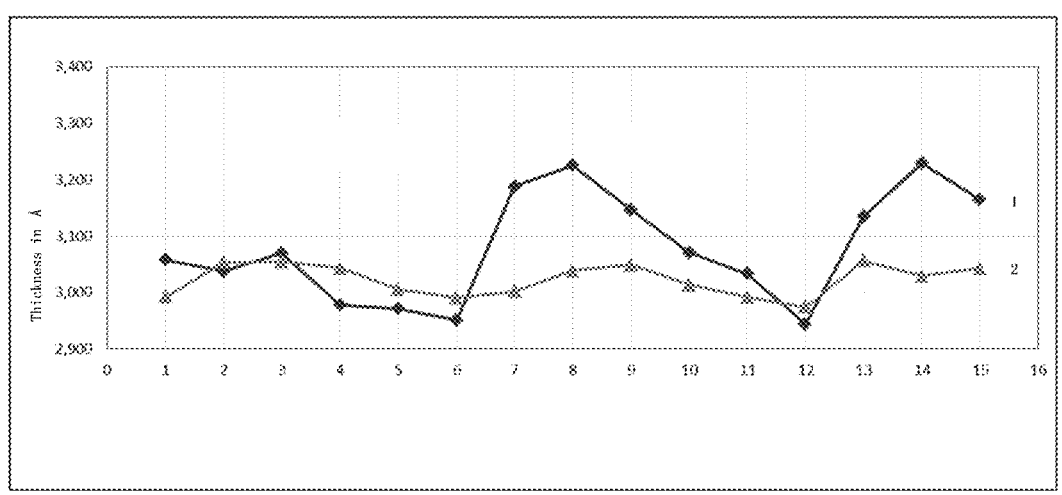
FIG. 4 is a graph illustrating the thickness fluctuation of a deposited metal layer among multiple wafers according to a conventional process and according to embodiments of the present invention.

FIG. 4 is a graph illustrating the thickness fluctuation of a deposited metal layer among multiple wafers according to results of a conventional process and according to results of a process of the present invention. The x-direction refers to a number of processed wafers, and the y-direction refers to the thickness of a deposited metal layer of the processed wafers in Angstroms (Å). Referring to FIG. 4, the ideal thickness of the deposited metal is 3000 Angstroms, the fluctuation in thickness of the deposited metal layer of the processed wafers in a conventional process (denoted as reference numeral "1") is relative large compared with the thickness fluctuation of the deposited metal layer of the processed wafers obtained according to embodiments of the present invention (denoted as reference numeral "2"). In other words, the thickness of the deposited metal layer among the wafers is more uniform and is close to the ideal thickness according to embodiments of the present invention.

Figure 5:
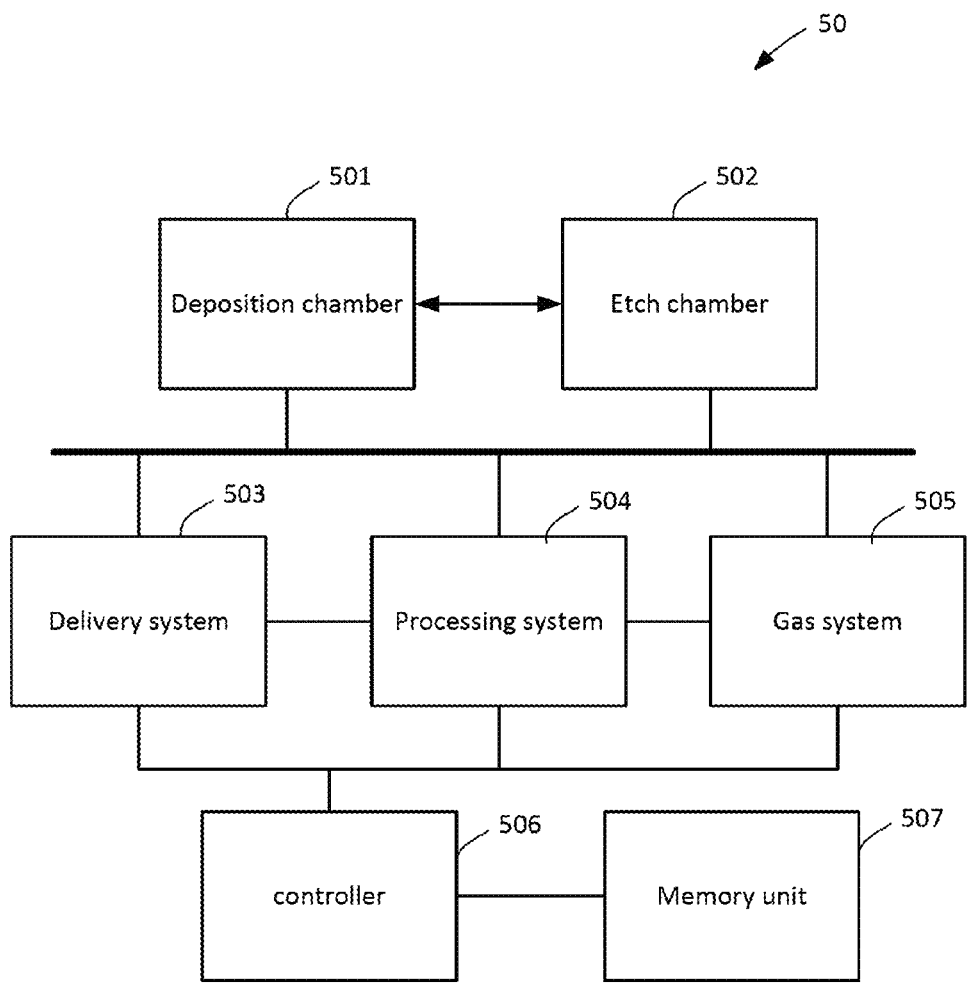
FIG. 5 is a simplified block diagram of a system for manufacturing a semiconductor device according to an embodiment of the present invention.

FIG. 5 is a simplified block diagram of a system 50 for manufacturing a semiconductor device according to an embodiment of the present invention. System 50 includes a deposition chamber 501, an etch chamber 502, a delivery system 503, a processing system 504, and a gas system 505. System 50 also includes a controller 506 and a memory unit 507. Deposition chamber 501 may include a first workstation (also referred to as station), a second station, one or more third stations, which can be respective first station 311, second station 312, and one or more third stations 313 of FIG. 3. Etch chamber 502 is coupled to deposition chamber 501 and configured to receive processed substrates that are provided by delivery system 503. Processing system 504 is configured to introduce gases of gas system 505 into the deposition chamber and the etch chamber for processing substrates provided by delivery system 503. Controller 506 is configured to control delivery system 503, processing system 504, and gas system 505 by executing instruction sets or computer program code stored in memory unit 507. Controller 506 may control process parameters such as process gas composition, flow rates, process temperatures and pressures, etc. The process parameters may be provided by a user and stored in memory unit 507.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although a deep trench is shown between two adjacent pixel regions, it is understood that the number of deep trenches and pixel regions can be more than two in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device comprising:
    providing a substrate;
    performing a nucleation process on the substrate to form a metal nucleation layer;
    performing a first deposition process at a first temperature on the metal nucleation layer to form a first metal layer;
    etching back the first metal layer using a first gas;
    cleaning the substrate including the etched back first metal layer using a second gas; and
    performing a second deposition process to form a second metal layer on the etched back first metal layer.

2. The method of claim 1, wherein the second gas is a reducing gas.

3. The method of claim 1, wherein the second deposition process comprises:
    forming a lower metal layer of the second metal layer at a first temperature; and
    forming an upper metal layer on the lower metal layer at a second temperature, the second temperature being higher than the first temperature.

4. The method of claim 3, wherein:
    the nucleation process is performed in a first station of a deposition chamber;
    the first deposition process is performed in a second station of the deposition chamber;
    the etching back is performed in an etch chamber;
    the cleaning is performed in the first station of the deposition chamber;
    forming the lower metal layer of the second metal layer at the first temperature is performed in the second station of the deposition chamber; and
    forming the upper metal layer on the lower metal layer at the second temperature is performed in one or more third stations of the deposition chamber.

5. The method of claim 1, wherein performing the nucleation process comprises using a first reaction gas including tungsten hexafluoride and silane or tungsten hexafluoride and diborane; and
    performing the first and second deposition processes comprise using a second reaction gas including tungsten hexafluoride and hydrogen.

6. The method of claim 1, wherein the metal nucleation layer is formed in a trench of the substrate.

7. The method of claim 1, wherein the first metal layer is made of tungsten, the first gas is a fluorine-containing gas, and the second gas is hydrogen.

8. The method of claim 7, wherein cleaning the substrate using the second gas is performed at a temperature in a range between 280° C. and 330° C. and with a flow rate of hydrogen in a range between 10,000 sccm and 16,000 sccm.

9. The method of claim 1, wherein etching back the first metal layer using the first gas is performed with the first gas being a nitrogen trifluoride gas with a flow rate of the nitrogen trifluoride gas in a range between 3 sccm and 20 sccm.

10. The method of claim 1, further comprising:
    planarizing the second metal layer.

11. The method of claim 1, wherein:
    the nucleation process is performed in a first station of a deposition chamber;
    the first deposition process is performed in a second station of the deposition chamber;
    the etching back is performed in an etch chamber;
    the cleaning is performed in the first station of the deposition chamber; and
    the second deposition process is performed in the second station or in one or more third stations of the deposition chamber.

* * * * *